United States Patent [19]

Smith

[11] Patent Number: 4,625,374

[45] Date of Patent: Dec. 2, 1986

[54] CAPACITOR LEAD WIRE MANUFACTURE

[75] Inventor: Ruslon J. Smith, Moscow, Pa.

[73] Assignee: Equipment Technology Incorporated, Peckville, Pa.

[21] Appl. No.: 670,558

[22] Filed: Nov. 9, 1984

[51] Int. Cl.$^4$ .............................................. H01G 4/00
[52] U.S. Cl. ..................................... 29/25.42; 29/241; 29/564.1; 29/747; 29/854
[58] Field of Search ......................... 29/25.42, 854–856, 29/433, 450, 747, 241, 564.1

[56] References Cited

U.S. PATENT DOCUMENTS

| | | |
|---|---|---|
| 2,766,510 | 10/1956 | Heibel . |
| 3,080,908 | 3/1963 | Weiss . |
| 3,091,835 | 6/1983 | Weiss . |
| 3,168,885 | 2/1965 | Weiss . |
| 3,231,082 | 1/1966 | Weiss . |
| 3,238,455 | 3/1966 | Janowski . |
| 3,315,331 | 4/1967 | Weiss ................................. 29/25.42 |

Primary Examiner—Carl E. Hall

Attorney, Agent, or Firm—Alexis Barron; Charles H. Lindrooth

[57] ABSTRACT

Apparatus and method for forming and inserting lead wires into openings provided in a movable carrier strip in the manufacture of products such as disc capacitors is disclosed. The carrier strip is provided with sets of openings disposed in transversely-spaced pairs aligned relationship with one another. The apparatus forms lead wire stock into a U-shaped subassembly with straight sections of lead wire stock spaced apart by an amount equal to the desired spacing between the lead wires. Mechanism is provided for holding the carrier strip in a bent position in which the pairs of openings of the sets are in straight-line paths through which the free ends of the straight sections of lead wire stock are advanced so that the lead wire assemblies are mounted on the strip. The carrier strip is advanced to the station at which the leads are mounted on it on a guide mandrel of curved cross section. Movably-mounted grooved guide means are moved into a guide position so that the leads pass through the openings at the lead wire mounting station and are subsequently moved to a retracted position to allow for lengthwise indexing of the carrier strip.

10 Claims, 6 Drawing Figures

4,625,374

CAPACITOR LEAD WIRE MANUFACTURE

FIELD OF THE INVENTION

This invention relates to method and apparatus for forming and inserting pairs of lead wires into openings provided in a movable carrier strip as a step in the manufacture of ceramic disc capacitors and like products.

BACKGROUND OF THE INVENTION

U.S. Pat. No. 3,315,331, issued Apr. 25, 1967, describes the steps of forming wire into a U or hair-pin shaped lead wire subassembly, feeding the subassembly so formed, round or bent end first, through pairs of longitudinally extended slits in a carrier strip, and advancing the strip to a series of forming stations at which disc-shaped capacitors are joined to the leads with one electrode joined to one lead of each pair of leads forming a subassembly. Thereafter, the rounded or bent end portion of each subassembly is cut off, and the capacitors are tested and stamped with suitable coding indicia. The present invention relates to improvements in the techniques for lead wire forming and for placement of the lead wire subassemblies on the carrier strip. In contrast to the process just described, the present invention forms the U-shaped lead wire subassemblies so that the free ends of the wire of each subassembly point towards paired spaced-apart openings in the carrier strip, and feeds the free ends through the transversely-spaced pairs of openings into proper position on the strip.

OBJECTS AND ADVANTAGES OF THE INVENTION

A primary object of the invention is the provision of method and apparatus for mounting lead wire subassemblies on a carrier strip in a manner which more accurately positions the lead wires of a subassembly in relation to one another and in relation to other lead wire subassemblies on the carrier strip.

A further object of the invention is the provision of method and apparatus for mounting lead wire subassemblies on a carrier strip in a more rapid and cost-effective manner than has heretofore been practical.

The foregoing and various other objects of the invention, which will become apparent from the detailed description that follows, are carried out by apparatus which includes a carrier strip, which is provided with pairs of openings in sets transversely disposed on opposite sides of the center of the strip, in aligned relationship with one another, with the openings of each pair of a set being each sized to admit a lead wire and being spaced apart by an amount equal to the desired spacing between the lead wires of each U-shaped terminal wire subassembly. Means are provided at a lead wire insertion station for imparting a transverse deformation to the carrier strip, to the extent that openings of oppositely-disposed pairs are positioned so that unrestricted straight-line paths for the ends of the terminal wires through the openings are formed. Means are further provided at the lead wire insertion station for forming the subassemblies into the U-shaped configuration and for passing the terminal wires, free ends first, along the unrestricted straight-line paths formed by deformation of the strip.

BRIEF DESCRIPTION OF THE DRAWINGS

In the drawings:

FIG. 4a is a fragmentary sectional view taken on line 4a—4a of FIG. 4; and

DESCRIPTION OF THE PREFERRED EMBODIMENT

Figure 1:
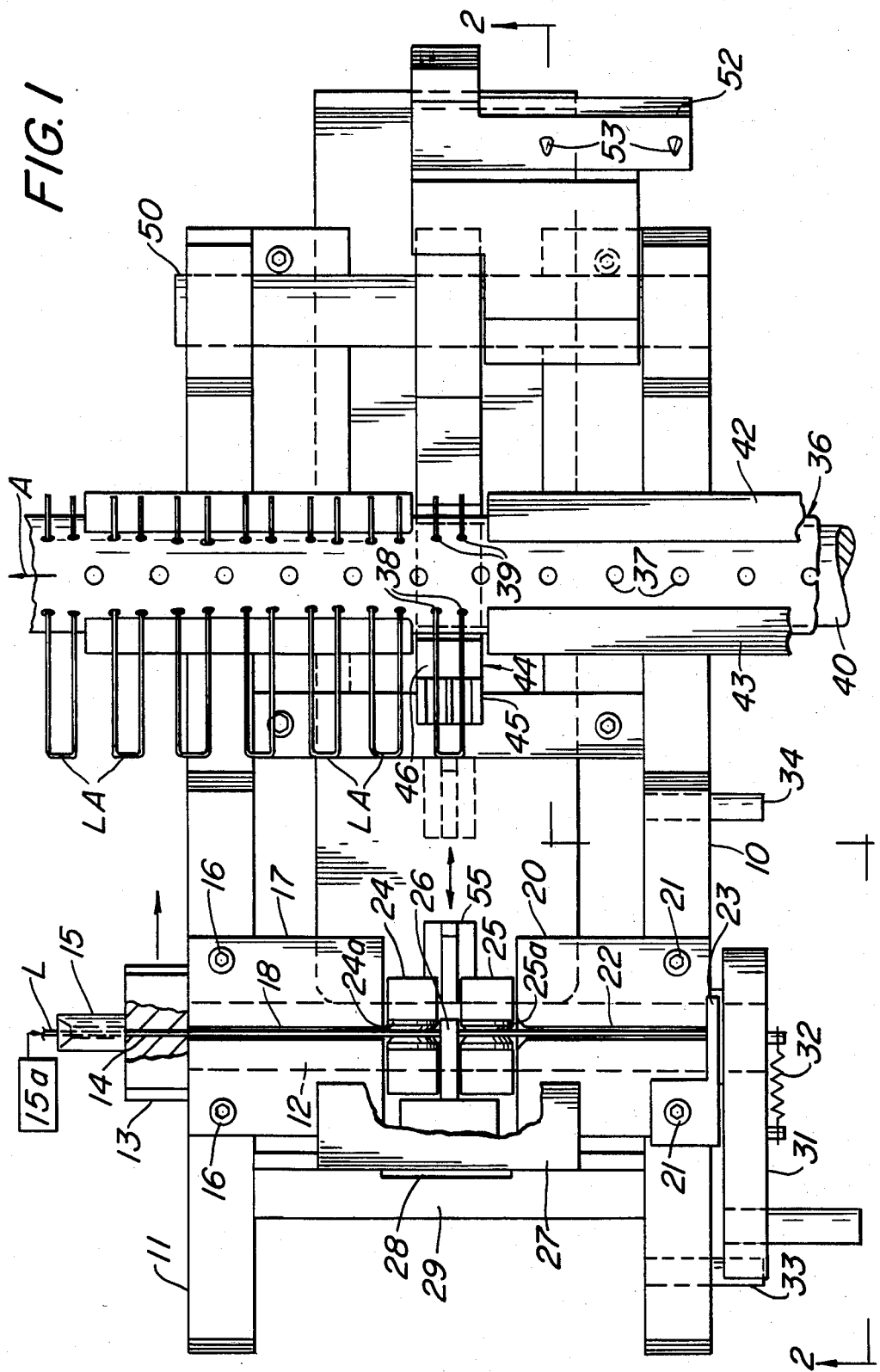
FIG. 1 is a plan view illustrating the apparatus of the present invention.

With particular reference to FIGS. 1-3 and 5, apparatus incorporating the preferred embodiment of the invention comprises means for feeding and forming lead wire stock "L" into lead wire subassemblies "LA" and means for mounting the formed lead wire subassemblies on a carrier strip of flexible paper, card stock or the like, for advancement to a station at which capacitors are attached to the free ends of the subassemblies. The apparatus is mounted in a pair of frame members 10 and 11, spaced in parallel relationship. A shaft 12 is journalled on both frame members. A wire stock cutter arm 13 is rotatably mounted on shaft 12. The arm has an opening 14 just large enough in diameter to receive lead wire stock "L". Preferably a wire guide tube 15 is secured on the arm in a position to guide the wire into opening 14. Also secured to the frame member 11 by machine bolts 16 is a guide block 17 having a wire guide groove 18 in its upper surface, the wire guide groove being axially aligned with the passageway 14. A similar guide block 20 is secured to frame member 10 by means such as machine bolts 21. Guide block 20 has a wire guide groove 22 in alignment with the wire guide groove 18 and passageway 14.

Wire-cutting arm 13 bears against the outer surface of side frame member 11 and guide block 17. When the arm is in the position shown in FIG. 1, passageway 14 is aligned with guide grooves 18 and 22 so that a wire passed through the passageway 14 by feed means, schematically shown at 15a in FIG. 1, is guided by the grooves 18 and 22 until it hits a stop 23, mounted on side frame member 10. Hardened steel, interfacing cutting surfaces are provided on the cutter arm adjacent the downstream end of the passageway 14 and on the block 17 at the inlet to groove 18. When the wire is positioned with its end against the stop 23, means are provided for rocking the cutter arm about shaft 12, by an amount sufficient to sever the lead wire at the interface between the arm and the guide block.

Figure 2:
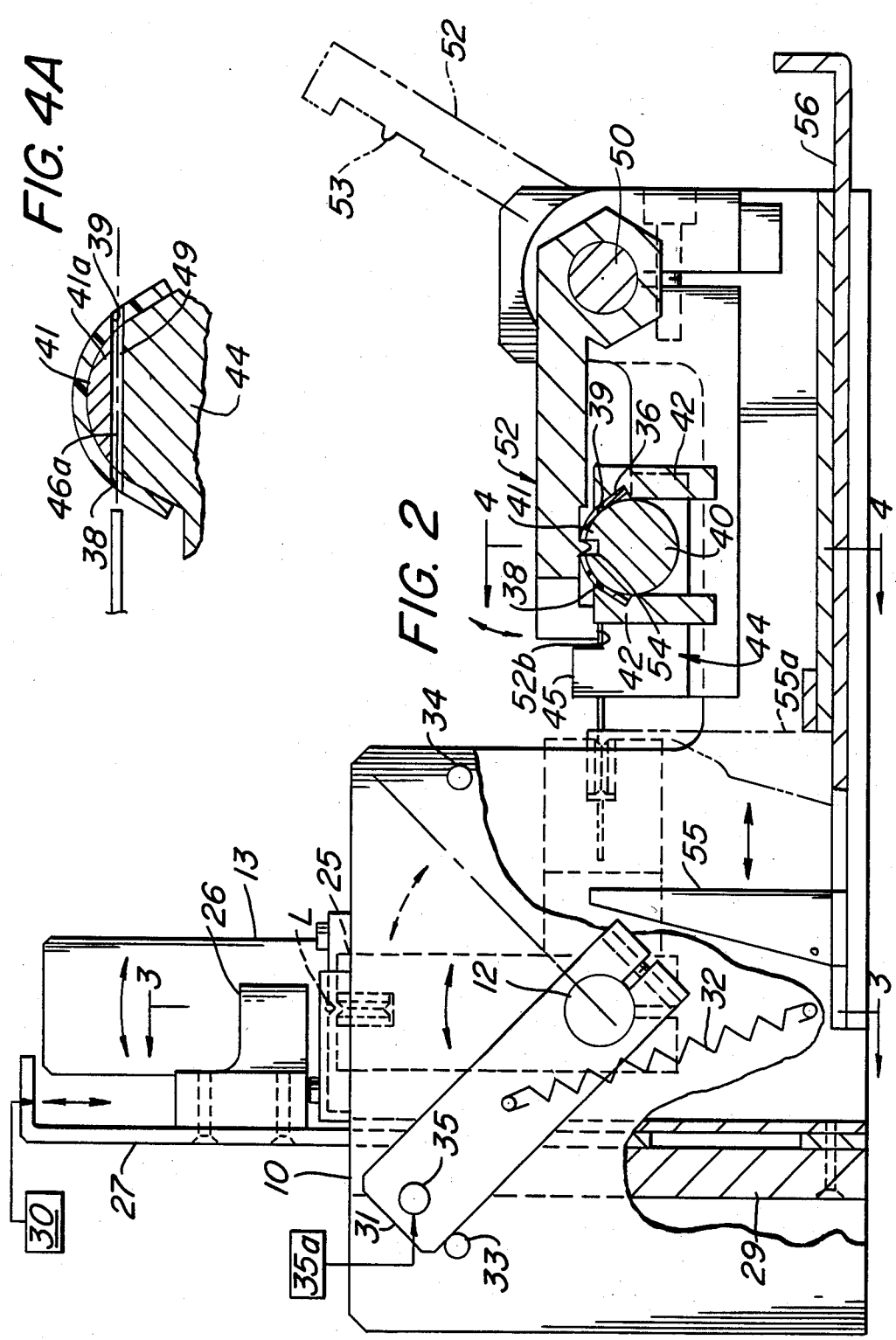
FIG. 2 is a side elevational view, with some portions illustrated in section, taken along lines 2—2 of FIG. 1.
Figure 3:
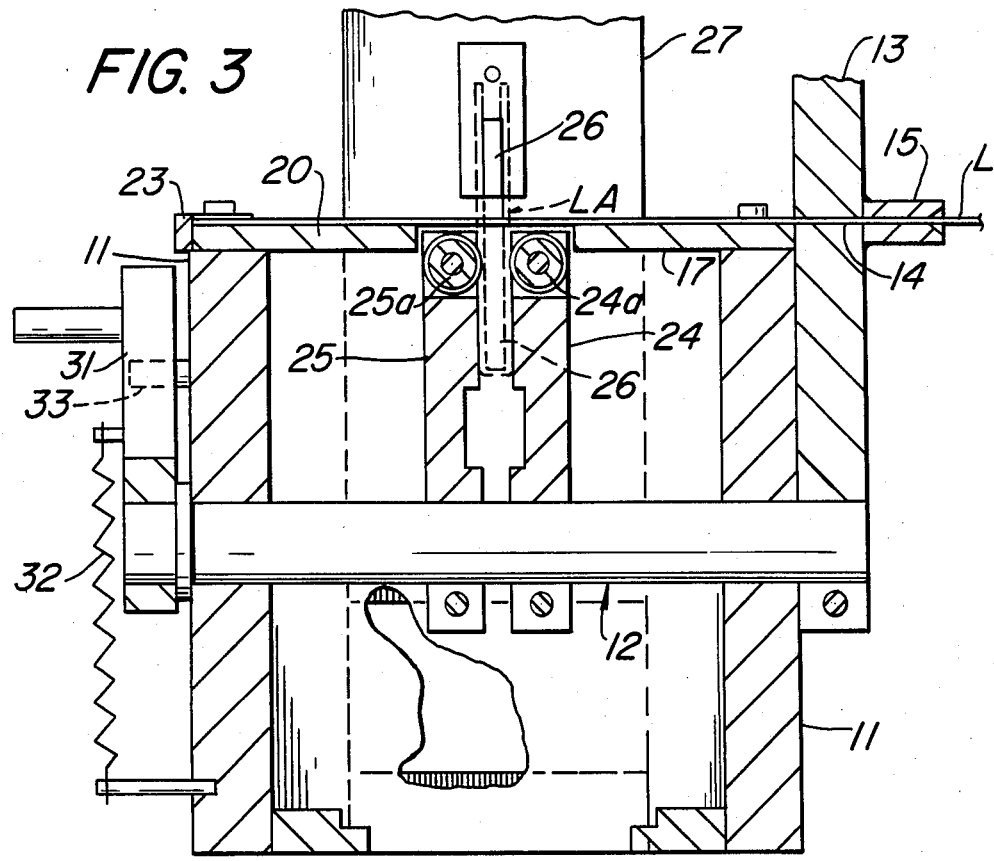
FIG. 3 is a sectional view of the lead wire subassembly forming mechanism of the invention taken on line 3—3 of FIG. 2.

As can be best seen in FIGS. 1 and 2, means for forming the lead wire into a U-shaped subassembly preferably comprise a pair of spaced-apart forming arms 24 and 25 which are fixed to shaft 12 by any suitable means. The forming arms 24 and 25 are provided with circumferentially-grooved rollers 24a and 25a at their upper ends. The grooves in the rollers are aligned with, but just below, grooves 18 and 22 so that the lead wire is positioned above each roller groove when the wire is moved to the position in which its end rests against stop 23.

To bend the wire into a U-shaped configuration, a reciprocally movable forming block 26 is positioned in alignment with the space between forming arms 24 and 25 and is mounted on a slider member 27 for movement vertically between a raised position shown in FIG. 2 and a lowered position between the two arms but just above shaft 12. Slider 27 is preferably mounted for vertical movement within a groove 28 in a plate 29 which interconnects the side frames 10 and 11. Movable means such as an air cylinder schematically shown at 30 move the slider and thus the forming block between its raised and lowered positions.

As noted above, forming arms 24 and 25 are secured for rotational movement upon shaft 12 from a vertical position shown in FIG. 2 to a substantially horizontal position, the parts being illustrated in both the horizontal and vertical positions in broken lines in FIG. 2. An actuating arm 31 fixed to one end of the shaft 12 moves the arms 24 and 25 between the vertical and horizontal positions. An over-center spring 32 urges the arm 31 to one or the other of its positions, once the arm is beyond its dead-center position. A pair of stops 33 and 34 fixed on the frame member 10 limit the movement of arm 31. An actuating pin 35 connected to drive means such as an air cylinder schematically shown at 35a move the arm from position abutting stop 33 to the position abutting stop 34, thus moving the forming arms from the vertical to the horizontal position.

In operation of the equipment so far described, lead wire stock L is fed through passageway 14 until its end abuts stop 23. Wire-cutting arm 13 is then rotated about shaft 12 to sever the lead wire stock at the interface between the inner surface of arm 13 and the outer surface of guide block 17. Air cylinder 30 is then activated to move slide 27 and forming block 26 downwardly between forming arms 24 and 25, bending the cut piece of lead wire into a U-shaped subassembly LA, this subassembly being positioned between and guided by the rollers 24a and 25a in the forming arms. Thereafter the forming arms are rotated ninety degrees to the horizontal position shown in FIG. 2 by movement of actuating arm 31 from the position abutting stop 23 to the position abutting stop 34. The lead wire subassembly is now positioned in a horizontal plane with ends extended towards the right as viewed in FIGS. 1 and 2 towards carrier strip 36.

Figure 5:
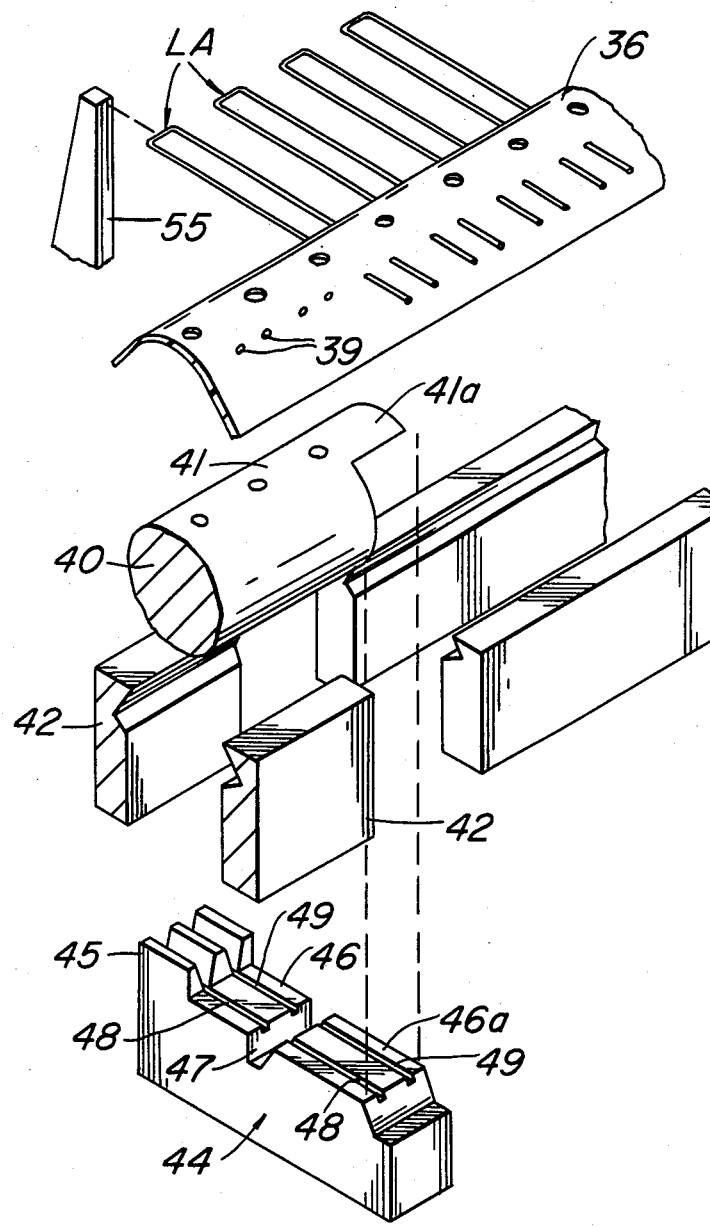
FIG. 5 is an exploded perspective view of portions of the apparatus shown in FIGS. 1, 2 and 4, illustrating placement of the lead wires on the carrier strip.

Means are provided for stepping flexible carrier strip 36 past the station at which the lead wire subassembly forming mechanism is located and for passing the free ends of the lead wire subassemblies through the sets of pairs of openings on the strip. Preferably the carrier strip is formed of a flexible material, such as paperboard, and provides a means on which the lead wire subassemblies are mounted for delivery to stations at which they are attached to the capacitors, the capacitors are tested, and the leads trimmed to the desired length. The carrier strip has spaced-apart positioning openings shown at 37, provided for the purpose of positioning and indexing the strip and further has sets of transversely-disposed openings 38 and 39 arranged in pairs to receive and support the ends of the leads in spaced-apart relationship as best shown in FIGS. 1 and 5. Preferably, openings 38 and 39 are sized to just admit the straight sections of the leads but are not so large as to permit movement of the straight sections toward or away from one another.

In order to guide the carrier strip, a feed mandrel 40 preferably having a substantially cylindrical upper surface 41 as best shown in FIG. 5 is fixedly mounted between a pair of grooved guide track members 42. As can be seen in FIG. 2, the mandrel 40 and the guide track members 42 impart a bend to the carrier strip in the direction extending transversely of its longitudinal axis as it is moved into the position at which the lead wire assemblies are mounted on it. As can be seen in FIG. 4a and as will be further explained hereinafter, in the bent position of the carrier strip, unrestricted straight-line paths extending through openings 38 and 39 are provided for the straight sections of each lead wire assembly. Guide track members 43 of similar configuration to guide track members 42 are located downstream therefrom and also serve to hold the carrier strip 36 in the curved configuration.

In order to guide the lead wire subassemblies through the pairs of openings 38 and 39, a guide means (best shown in FIGS. 2, 4 and 5) comprising a lower guide member 44 having a raised portion 45, and flat upper surfaces 46 and 46a separated by a cutaway portion 47, is positioned adjacent the end of mandrel 40. A pair of lead wire guide grooves 48 and 49, spaced apart to receive the two ends of the lead wire subassembly, extend lengthwise of the raised portion 45 the surfaces 46 and 46a. The guide member 44 is preferably mounted on a shaft 50 for rocking movement between the position shown in FIG. 2 and a lowered position in which raised portion 45 is below the plane of the lead wires when the forming arms 24 and 25 are in the broken line horizontal position shown in the drawing.

Figure 4:
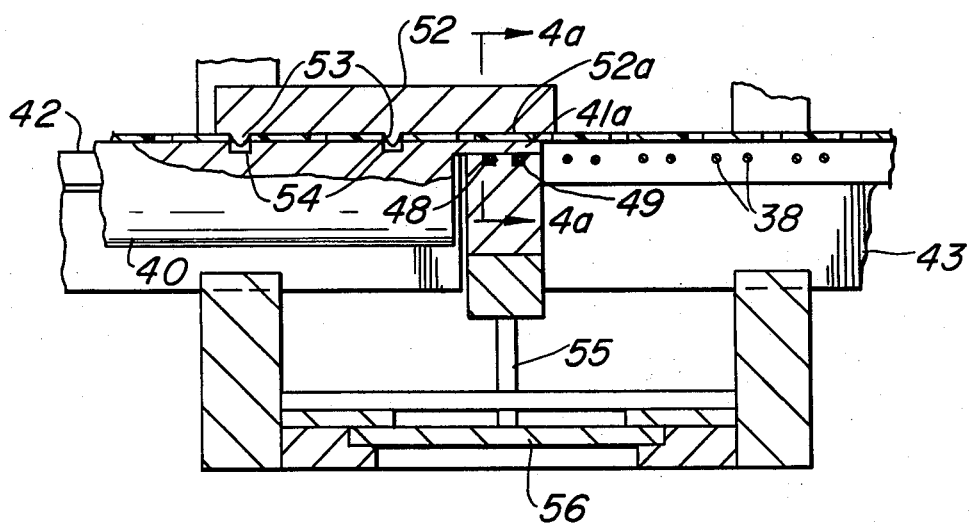
FIG. 4 is a fragmentary sectional view taken on line 4—4 of FIG. 2.

FIG. 4 shows the relationship of the lower guide member 44 to the mandrel 40 and the carrier strip when the guide member 44 is in the raised position and the parts are positioned to receive the lead wires of a subassembly. As can be seen from this view, the end of mandrel 40 is formed with an extension 41a which projects over the lead wire guide grooves 49. In the raised position of the guide member 44, the undersurface of the mandrel extension 41a rests upon upper surface 46a of the guide member so that the tops of the grooves 48 and 49 in the region of surface 46a are closed. As best shown in FIGS. 4 and 4a, the carrier strip is deformed to the extent that the pairs of openings 38 and 39 are positioned below the planar undersurface of mandrel portion 41a and are in alignment with the grooves 48 and 49. Thus, a continuous guide path is provided for the lead wires of each subassembly as they are moved along grooves 48 and 49 through the openings 38 and 39 in carrier strip 36.

The apparatus also preferably includes top guide means including a top guide member 52 which is freely mounted for rotary movement on shaft 50. Top guide 52 is preferably provided with a plurality of spaced strip locator projections 53 which are adapted to fit through the openings 37 in the carrier strip and into holes 54 which are drilled in spaced-apart relationship in the upper surface of the mandrel 40 in order to hold the carrier strip in aligned relationship relative to the ends of lead wires when the lead wire subassembly is moved into the position in which the straight sections are in the straight-line paths extended towards and through the carrier strip openings 38 and 39 as shown in FIG. 2. The top guide 52 is preferably spring-loaded to the raised position, this position being shown in broken lines in FIG. 2, and is moved to the lowered, full-line position also shown in FIG. 2 by suitable camming means not shown in preparation for the mounting of a lead wire subassembly on the carrier strip. Preferably, the top guide has a surface position 52a (see FIG. 4) which holds the carrier strip against the upper surface of mandrel extension 41a and a surface portion 52b which rests on the surface 46 of guide member 44 in order to provide further assurance that the ends of the leads are maintained within grooves 49, as they are advanced towards the openings in the carrier strip.

In order to advance the lead wire subassemblies when the arms 24 and 25 are moved to the horizontal position, means are provided which preferably comprises a pusher 55 which is mounted in aligned relationship with the space between the arm on a reciprocally movable slide 56. The end of pusher 55 is located in the full-line position shown in FIG. 2 upon movement of the forming arms 24 and 25 from the vertical to the horizontal position. Once the forming arms are in the horizontal position, the pusher 55 projects into the space between the arms in back of the lead wire subassembly and is thereafter advanced to the right as viewed in FIG. 2, engaging the bridging part of the lead wire subassembly and moving the subassembly through the grooves 48 and 49 in guide member 44, and into both pairs of openings 38 and 39 in the carrier strip. Once the forward surface of the pusher 55 has advanced to the position indicated by the reference character 55a in FIG. 2, guide member 45 is lowered and guide member 52 is raised, permitting the carrier strip to be indexed lengthwise of the mandrel in the direction of Arrow A in FIG. 1 until the next set of pairs of openings is positioned to receive the leads of the next lead wire subassembly.

Although the operation of the invention should be apparent from the foregoing, the following summary of operation should make clear all aspects of the interrelationship between the parts. With reference first to FIGS. 1 and 2, lead wire stock L is fed through passageway 14 and along guide grooves 18 and 22 until the wire abuts against stop 23. Wire-cutter arm 13 is then rotated about shaft 12, severing the lead wire stock to the desired length. Thereafter forming block 26 is reciprocated, drawing the wire stock downwardly between the rollers 24a and 25a on the forming arms 24 and 25 thus forming the wire into a U-shaped assembly. Once the forming block is retracted, actuating member 31 is moved from the position adjacent stop 33 to the position adjacent stop 34, moving the forming arms to a position in which the lead ends extend toward the right as viewed in FIG. 4. The carrier strip is advanced into position in which a set of openings 38 and 39 is opposite to the lead wire forming station. At this point, separate actuating means, not shown, raise lower guide 44 and lower upper guide 52, and in this position the carrier strip is located with openings 38 and 39 in alignment with the grooves 48 and 49 in the upper surface of guide member 44. Pusher 55 is thereafter moved towards the right as viewed in FIG. 2 advancing the free ends of the leads along the paths formed by grooves 48 and 49 through the openings 38 and 39 in the carrier strip. Lower guide member 44 is thereafter rocked in a counterclockwise direction about the axis of shaft 50 and upper guide member 52 is rocked in the clockwise direction to the broken line position shown in FIG. 2. The carrier strip is now free to be advanced in the direction of Arrow A to a position in which the next pair of openings 38 and 39 are positioned to receive the pair of leads of the next subassembly. In the meantime, pusher 55 has retracted to the full-line position of FIG. 2 and the forming arms have been moved to the vertical position so that the next piece of lead wire stock can be advanced and the process repeated.

Although not specifically described for purposes of simplification, various operations of the apparatus of the invention are carried out substantially automatically by means well known to those of ordinary skill in the art, as by the operation of a series of cam actuated switches which in turn actuate solenoids, pneumatic devices or the like which sequentially operate various portions of the apparatus.

The invention provides a rapid and reliable means and method of accurately positioning the lead wires on a carrier strip prior to the attachment of the capacitors onto the ends of the lead wires. An advantage of the invention is that openings 38 and 39 in the carrier strip can be dimensioned to accurately hold the lead ends in a predetermined spaced-apart relationship so that they are accurately positioned relative to each other and to those of other lead wire subassemblies when the capacitors are formed on the ends of the wires. With this arrangement the number of rejects is substantially reduced with the consequence that production costs can be significantly lowered.

What is claimed is:

1. In a machine for the manufacture of electrical components having a body and substantially parallel lead wires extending therefrom, said machine comprising an elongated movable carrier strip for the components, said carrier strip having a plurality of sets of openings disposed in transversely-spaced pairs extending through the strip in aligned relationship with one another, carrier strip support means for guiding and flexing the carrier strip transversely into a position in which the openings of each pair are in straight-line paths, movable means for passing straight sections of lead wire stock along said straight-line paths and through each of said openings to a position in which each straight section is mounted on the strip with its ends extended through the openings.

2. In a machine according to claim 1, wherein the lead wire stock is in the form of a U-shaped subassembly having a pair of elongated straight sections, wherein said movable means comprises means for advancing said U-shaped subassembly with the straight sections lying in parallel, straight-line paths intersecting adjacent pairs of openings and moves the subassembly free ends first into said position in which said straight sections are passed through said openings.

3. Apparatus according to claim 1 wherein the means for flexing the carrier strip comprises a carrier strip support mandrel having an elongated guide surface which is curved transversely of its long axis, said mandrel extending lengthwise of and defining the path of travel of the carrier strip and guide means adjacent the mandrel for flexing the sides of the carrier strip against the mandrel.

4. Apparatus according to claim 2 wherein said carrier strip support means comprises a mandrel having a transversely-curved support surface portion and a planar surface portion said transversely-curved portion extending to and intersecting the planar surface, said planar surface portion being disposed adjacent to and extended parallel to the parallel straight-line paths for said pairs of straight sections of lead wire stock.

5. Apparatus according to claim 4 further including a lead wire stock guide member, said guide member having a planar surface adjacent to the planar surface portion of the mandrel, means for moving the guide member a position in which the planar surfaces are abutting, a pair of parallel guide grooves in the planar surface of the guide member, said grooves being coaxial with the parallel straight-line paths for said pairs of straight sections of lead wire stock for receiving and guiding said sections through said openings, the guide member further being movable to a position in which the said grooves are out of the paths for said pairs of sections of lead wire stock.

6. Apparatus according to claim 5, said movable means for said lead wire stock being actuatable to advance said straight sections of lead wire stock when the surfaces are abutting and further including means for advancing the carrier strip lengthwise of the mandrel from a position in which a first set of pairs of lead wire openings are aligned with said straight-line paths to a position in which a second set of lead wire openings are aligned with said straight-line paths when the guide member is moved to said position in which said grooves are out of the paths for said pairs of sections of lead wire stock.

7. Apparatus according to claim 6 further including a second movably mounted guide member at said transfer station, said second guide member being movable to a position in which it holds said carrier strip against the mandrel when the first guide member is moved into positions in which said planar surfaces are abutting and cooperating strip locator projections and cavities on said second guide member and said curved mandrel surface, said strip having spaced registry openings disposed lengthwise thereof, said strip locator projections extending through said registry openings into said cavities when the pairs of transversely disposed carrier strip openings are in alignment with said parallel straight-line paths.

8. Apparatus for the manufacture of electrical components having a pair of parallel lead wires extending from an electrical component body, said apparatus comprising a carrier strip having pairs of openings disposed in sets, the openings of each set being disposed in pairs on opposite sides of the long axis of the strip, the openings of a pair being spaced apart by the distance between lead wires on an electrical component and openings of one pair of a set being in alignment with the openings of the other pair of the set, means for deforming the strip about its long axis whereby unrestricted straight-line paths extend through the lead wire openings of one pair of a set and through the openings of the other pair of a set, and means for advancing a pair of lead wires along said paths into positions intersecting said openings of a set.

9. Apparatus according to claim 8 further including means for forming lead wire stock into a U-shaped lead wire assembly having parallel elongated straight sections and means for moving said assembly with the free ends extended towards the lead wire openings on the carrier strip, first through one pair of openings of a set and then through the other pair of openings of the set.

10. Apparatus according to claim 9 wherein said lead wire forming means comprises a pair of spaced-apart forming members, means for positioning pieces of lead wire stock adjacent the ends of said forming members in a position extending across the space between said members, a reciprocable forming bar movable into said space from a position separated therefrom for deforming the lead wire stock in said U-shaped subassemblies, means mounting said forming members for movement from a position remote from the carrier strip to a position in which the lead wire subassemblies lie in the plane of said lead wire straight-line paths with the straight sections in the straight-line paths and the free ends of the straight sections extending towards the openings of a pair of openings on said carrier strip.

* * * * *